United States Patent [19]

Woy

[11] Patent Number: 4,660,124
[45] Date of Patent: Apr. 21, 1987

[54] ELECTRICAL CIRCUIT WITH HIGH THERMAL DISSIPATION

[75] Inventor: Thaddeus W. Woy, Warren, Mich.

[73] Assignee: Chrysler Motors Corporation, Highland Park, Mich.

[21] Appl. No.: 725,846

[22] Filed: Apr. 22, 1985

[51] Int. Cl.⁴ .............................................. H05K 7/20
[52] U.S. Cl. ..................... 361/386; 361/388
[58] Field of Search ............... 174/16 HS; 361/358, 361/379, 386–388; 165/185

[56] References Cited

U.S. PATENT DOCUMENTS 4,029,999 6/1977 Neumann et al. ..................... 361/386
4,475,145 10/1984 Heil et al. ............................ 361/386

FOREIGN PATENT DOCUMENTS 1365877 9/1974 United Kingdom ................ 361/387

*Primary Examiner*—A. D. Pellinen
*Assistant Examiner*—Gregory D. Thompson
*Attorney, Agent, or Firm*—Kenneth H. MacLean, Jr.

[57] ABSTRACT

In a vehicle, an air conditioning control with electrical circuit means for carrying substantial current between selective switches located at one part of the assembly where accessible to a vehicle occupant and terminals located at an opposite part adapted to connect to a wiring harness to feed remotely located air conditioning components. The control assembly includes a base member which supports selective controls or switches with a face panel identifying the switches and a circuit carrying sub-assembly including a molded plastic circuit frame which operatively engages the base member in mating face to face contact. The sub-assembly frame supports metal circuit elements in the form of side-by-side terminal strips with a plurality of removable integral connector strips therebetween. The frame further has channel means molded into its surface which mates with the base member. The channels conform to the configuration of the metal circuit elements so that the surfaces of the frame and the circuit elements are substantially co-planar. The co-planar circuit elements and frame mate with or engage a surface of the base member to thereby capture the circuit elements therebetween in good heat transfer contact with both. Further, the framing member includes access means to permit removal of the connector strips between the circuit elements subsequent to mating the base and the frame.

4 Claims, 6 Drawing Figures

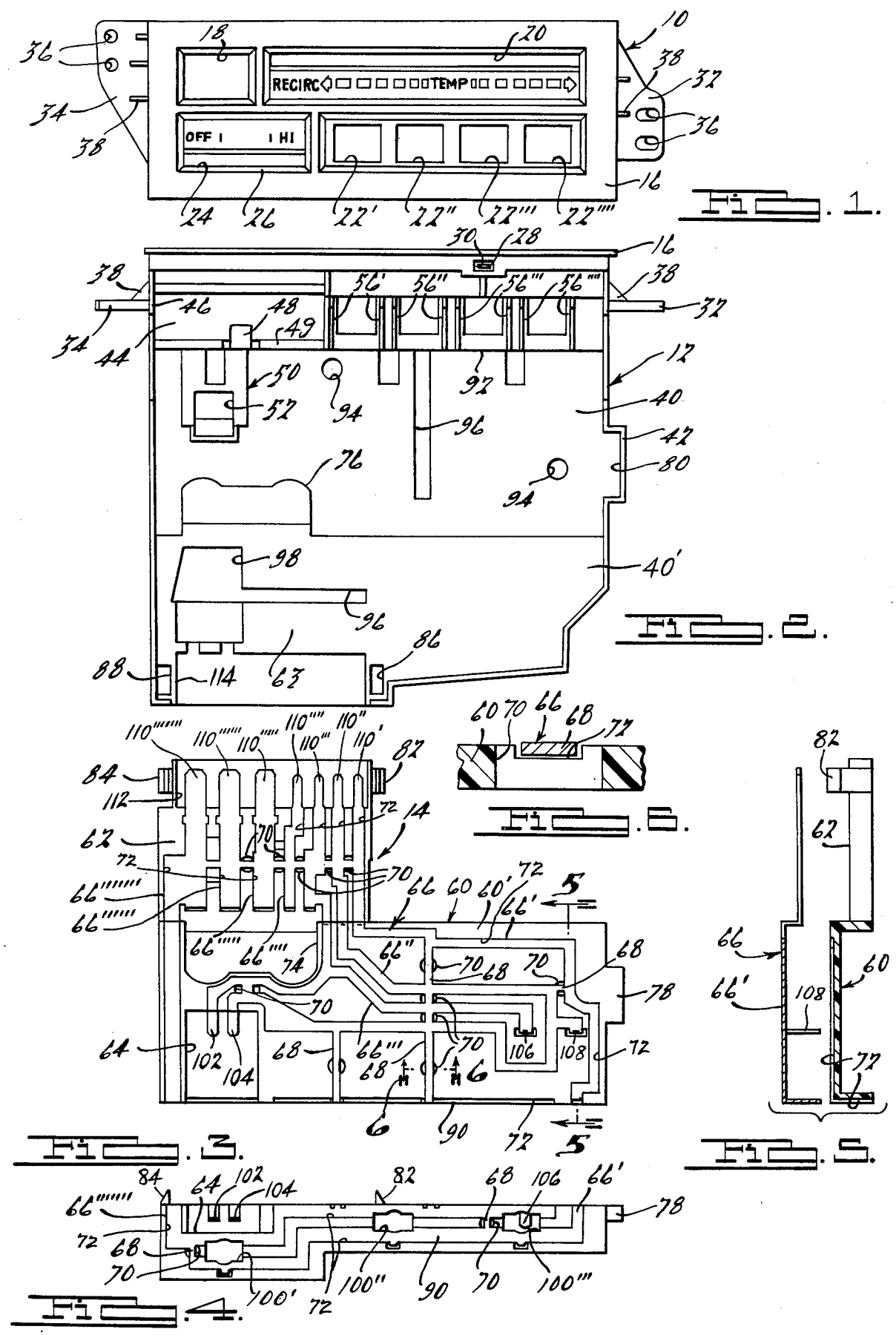

ELECTRICAL CIRCUIT WITH HIGH THERMAL DISSIPATION

BACKGROUND OF THE INVENTION

This application concerns a control for vehicle air conditioning assemblies and, specifically, a control assembly for carrying substantial current through metal circuit elements which are mounted in channels formed in the surface of a support or frame member to form a co-planar surface which is subsequently mated in face-to-face contact with another base member whereby heat from current through the circuit elements is readily dissipated into the surrounding base and frame members.

It is desirable to provide an air conditioning control assembly with multiple circuit means or elements therein to carry electrical currents from a terminal side of the control to an opposite switch side of the control. By this means, substantial separate wiring which has previously been used in controls is eliminated. In addition, the use of terminal strips or elements in the control, as opposed to wires, permits heat generated from the current to be dissipated into the plastic support components.

For relative ease of assembly, the control includes a base member which is adapted to support a number of switches to control electrical activity of the air conditioning system. The base member has a substantially flat surface formed thereon. The control further includes a circuit carrying sub-assembly with a frame member of preferably molded plastic material having channels formed therein extending from one side portion to an opposite side portion for the reception of metal circuit strips. Because individual circuit elements would be difficult to arrange and assemble to the frame when in separated form, they are provided instead in a one piece configuration permitted by small interconnecting elements between strips. After the circuit means is in place in the recessed channels of the frame member, connector strips may be removed so as to leave separate circuit elements. To facilitate this, the base and frame have a number of openings therethrough to permit a tool to remove portions of the connectors and, thus, form electrically insulated terminal strips extending in the channels.

Therefore, an object of the present invention is to provide an improved control for vehicle air conditioning, including a base and a frame member and a plurality of electrical current carrying elements or strips supported in good heat transfer relationship in a channelled surface portion of one member, the engaging base and the frame member being matingly engaged together in face-to-face engaging relation with the circuit elements therebetween.

A further object of the present invention is to provide a control for a vehicle air conditioning system in which a surface of a base member and a channeled surface of a framing member are positioned in face-to-face engagement with metal circuit elements extending in the channels and in good heat transfer relation to both members whereby the metal circuit elements located between the members are initially formed as a one piece assembly including side-by-side elongated elements which are interconnected by small connecting portions therebetween and with aperture and access means in the framing member and the base member to permit a tool to remove the connecting strips once the circuit means is in place.

Further objects and advantages of the subject invention will be more readily apparent from a reading of the following detailed description, reference being had to the accompanying drawings in which a preferred embodiment of the control assembly is illustrated.

IN THE DRAWINGS

FIG. 1 is an elevational view of the face of the control assembly which would be accessible to a vehicle occupant;

FIG. 2 is a planar view of the control assembly base member looking upward at the bottom surface of the assembly shown in FIG. 1;

FIG. 3 is a planar view of a circuit framing member including a one piece metal circuit means mounted within channels in the surface thereof and looking at an upwardly facing surface thereof when assembled to the base member of FIG. 2 into the configuration of the assembled control oriented as in FIG. 1;

FIG. 4 is the end view of the circuit framing member and circuit means showing in FIG. 3;

FIG. 5 is an exploded side view and partial section along section line 5—5 in FIG. 3 with the frame portion separated from the circuit means portion for clarity; and FIG. 6 is an enlarged sectional view taken along section line 6—6 in FIG. 3 looking in the direction of the arrow showing one of the many interconnecting strips of the circuit means as mounted in a channel of the framing member.

DETAILED DESCRIPTION OF THE EMBODIMENT

In FIG. 1, a view of the control assembly 10 is shown as would be viewed by a occupant in a vehicle. In FIG. 2, a bottom surface view of the base support member 12 of assembly 10 is shown. In FIGS. 3 and 4, a circuit carrying sub-assembly 14 is shown in both top and end views. The surface of sub-assembly 14 in FIG. 3 engages the surface of base member 12 in FIG. 2 in a manner to be described in more detail hereinafter.

In FIGS. 1 and 2, the base member 12 supports a face plate or panel member 16 to provide an attractive and informative display for various control components or switches (not shown). The face panel 16 includes various windows or apertures 18, 20, 22;40 , 22″, 22‴, 22⁗ and 24. Specifically, aperture 18 is an access opening for an air conditioning on/off switch (not shown). The elongated opening 20 is adapted to permit the extension therethrough the operative end (not shown) of a pivotal lever to adjust for a desired selective temperature output for the air conditioning and heating system. The windows or opendings 22′, 22″, 22‴, 22⁗ are for permitting selective access to the following functional mode switches (not shown); 22′ is for a panel switch to provide airflow from upper level outlets, 22″ is for a switch to provide airflow from both upper outlets and a floor outlet 22‴, is for a switch to provide airflow only from a floor outlet, and 22⁗ is to provide airflow through defroster outlets at the base of the windshield. The elongated opening 24 is adapted for projection of an operative end of a blower motor speed control switch. The various openings 18, 20, 22′, 22″, 22‴, 22⁗ and 24 are framed by beveled surfaces 26 (only one of which is labeled in FIG. 1). The face panel 16 is held to the base member 12 by means of tabs of the face panel which project into openings in the member 12, the connection by one of these tabs 28 in opening 30 being shown in FIG. 2. The control 10 is mounted within a dashboard opening by means of fasteners (not shown). Specifically, side brackets 32 and 34 extend from the right and left hand sides of the base member 12. Holes 36 in the brackets 32 and 34 are for receiving screw type fasteners. The brackets 32 and 34 are strengthened relative to the base member 12 by means of ribs 38 between the brackets and the main portion of member 12, as representatively labelled in FIG. 1.

As best shown in FIG. 2, the base member 12 includes a generally flat area designated by numeral 40 which is slightly recessed relative to a similar flat area 40' in FIG. 2. Areas 40 and 40' are encircled generally by a raised edge portion 42 which extends along either side and about half of the bottom of member 12. A small flat area 44 in the upper left hand portion of member 12 is considerably elevated with respect to the areas 40 and 40'. The numeral 46 points to a raised edge surface with respect to the edge 42 and is carried out on both the left and the right sides of the member 12 as shown in FIG. 2. The flat surface 44 is particularly adapted for mounting the previously mentioned blower motor control switch. The blower mower switch is positioned on the surface 44 and relative to the elongated opening 24 of the face member 16 by tab portion 48 extending from a raised wall portion 49. Located immediately beneath the raised surface 44 is a boss 50 which projects upwardly from the flat surface 40. The boss 50 includes opening 52 extending through the member 12 and the previously mentioned air conditioning on/off switch assembly is mounted there and is accessible to a vehicle occupant through the aperture 18 in the face panel 16. Rightward of the surface 44 are four side surfaces 56', 56", 56''', and 56'''' for mounting of the four switches which are accessible through the windows 22', 22", 22''', and 22'''' in the face panel 16. The various surfaces previously mentioned are formed by upwardly projecting thin walled portions immediately to the right and left of the indicated wall surfaces.

In FIGS. 3 and 4, a circuit sub-assembly 14 is illustrated including a molded plastic frame member 60 with numerals 60' and 62 identifying two flat surfaces thereof. In the lower left hand corner of sub-assembly 14 is a depressed pocket 64 adapted to receive or accept the projecting portion 50 shown in FIG. 2 generally when the sub-assembly 14 is mated to member 12 to be explained in more detail hereinafter. The surface 60', 62 of the molded framing member supports an integral circuit means 66 stamped from metal and primarily composed of seven elongated circuit elements or 66'–66''''''. The metal circuit is so formed to extend relative to surface 60', as well as the surface 62. The surfaces 60' and 62 are generally parallel, but are not in the same plane, the surface 62 being lower than the surface 60' as shown in FIG. 3. The seven circuit elements are interconnected to form the one piece circuit means by numerous small interconnecting portions 68 (not all so labelled in FIGS. 3 and 4). The surfaces elements and interconnections are mounted in channel means 72 recessed with respect to the surfaces 60'', 62 of the framing member. The channel means 72 also extends across the end face surface as shown in FIG. 4. The channel means include several elongated and separate channels or grooves which, for the most part, extend in generally side-by-side relationship, one with another. For a clearer understanding of how the circuit means is assembled to the framing member, reference is made to FIG. 5 in which the circuit means 66 is slightly spaced from framing member 60. Several separate channels 72 are formed in the surfaces of the framing member for receiving the various circuit elements 66'–66''''''.

As best seen in FIG. 6, one interconnecting portion 68 is mounted slightly spaced relation to the bottom and side walls of a channel means 72 formed in the molded plastic framing member 60. The spacing in FIG. 6 is somewhat exaggerated to promote clarity. The interconnecting portion 68 extends across an aperture 70 in the framing member 60. The aperture 70 is for the purpose of permitting a tool to extend through the aperture and remove a portion of the interconnecting strips once the circuit means 66 is secured to the framing member 60. After the many interconnecting portions are removed, the circuit elements 66'–66'''''' are separate.

Shown in FIG. 3 is an elongated aperture 74 through the framing member 60. The aperture 74 receives the similarly configured upstanding boss portion 76 formed on member 12 as is shown in FIG. 2.

Subsequent to mating circuit means 66 to the framing member 60, the subassembly is mated to the base member 12. The mating is of the members shown in FIGS. 2 and 3. Specifically, the assembly 60 is flipped over so that surface of assembly 60 visible in FIG. 3 overlies visible surface 40 and 40' of member 12 shown in FIG. 2. Thus, the rightwardly projecting tab 78 of member 60 will interfit in the rightwardly extending walled portion 80 in FIG. 2. The circuit sub-assembly 60 includes upwardly extending and barbed projections 82 and 84 shown in FIG. 3 which are adapted to engage openings 86 and 88, respectively, in the base member 12 when the sub-assembly 60 is flipped over and thereby brought into proper engagement with the assembly 12. In the assembled position, the end face 90, shown in FIG. 4, bears against the surface 92 of the base member 12 shown in FIG. 2.

When assembled in the aforedescribed position, members 12 and 60 capture the circuit elements within the channel means 72. This provides good heat transfer contact between the circuit means 66 and the two members. When assembled, the interconnecting portions 68 of the circuit means 66 and the openings 70 in the framing member 60 are aligned with appropriate apertures 94 in member 12 or with recesses 96 and 98 in member 12. This interaction facilitates the removal of the interconnections 68 between circuit elements 66'–66''''''.

Another advantageous feature of the subject control is best understood from the configuration of the end of the sub-assembly 60 in FIG. 4. Specifically, the end surface includes apertures 100', 100" and 100''' in a generally rectangular form to define socket shaped openings. These sockets are for the purpose of contact base portions of lightbulbs which extend into similarly arranged and aligned openings of surface 92 in base member 12. The socket portions 100', 100" and 100''' are framed at the upper and lower edges, respectively, by the circuit elements 66'''''' and 66'. These circuit elements (66', 66'''''') of the circuit means 66 are folded over the end surface of the framing member 60 for the purpose of energizing the lightbulbs thereby providing illumination behind the face panel 16. By this means, considerable wiring is eliminated in the subject control assembly.

The depression 64 in assembly 60 accepts the upstanding portion 50 of member 12 shown in FIG. 2. Specifically, the upstanding portion 50 of base 12 has a hollow interior to house the air conditioning activation switch which is accessible through face panel opening 18 as shown in FIG. 1. The electrical connection to the a/c switch is direct to end portions 102 and 104 of circuit elements 66‴ and 66″ as shown in FIG. 3. Separate wiring for the switch is eliminated by this means. Likewise, the terminal ends 106 and 108 in FIG. 3 extend through openings in the frame member 60 and are accessible for a direct connection to a component or wire harness without separate wiring in the control. Farther routing of electrical circuitry to or from the control assembly, is handled by the end portions 110′–110‴‴‴ which are directly accessible through the end of the control 10 as formed by corresponding recesses 112, 114 in the frame member 60 and in the member 12.

Although only one embodiment of the subject air conditioning control has been illustrated in the drawings and described in the above detailed description, it is obvious that minor variations thereof are contemplated and the invention is as described in the following claims.

What is claimed is as follows:

1. An air conditioning control assembly comprising: a base member of electrically insulative material and having generally flat surface means;
   a circuit framing member of electrically insulative material and having flat surface means corresponding with the surface means of the base member permitting face-to-face surface engagement when in an assembled relationship together;
   electrical circuit means captured between the base support member and the circuit framing member;
   the electrical circuit means including several elongated circuit elements extending generally in side-by-side relation and initially joined together by severable interconnecting portions to form a one piece integral member readily mated to the circuit framing member before subsequent assembly to the base member;
   the circuit framing member being of molded plastic material with several channels recessed in its flat surface means which are dimensioned and configured to receive the one piece circuit means, including the circuit elements and the interconnecting portions therebetween and with the channels sufficiently deep to allow the surface means of the framing member and circuit elements to be co-planar and closely engage the surface means of the base member;
   the framing member and base member having aperture means therein in corresponding overlying relationship to the interconnecting portions between the circuit elements thereby providing access after mating of the base and frame members to sever the interconnects between the circuit elements;
   means to mate the corresponding surface means of the base member and the framing member with the circuit elements therebetween so that the circuit elements engage the members in good heat transfer relationship.

2. An air conditioning control assembly comprising:
   a base member of electrically insulative material and having generally flat surface means;
   a circuit framing member of electrically insulative material and having flat surface means corresponding to the surface means of the base member permitting face-to-face surface overlying engagement when assembled together;
   electrical circuit means captured between the base member and the circuit framing member;
   the electrical circuit means including several elongated circuit elements extending generally in side-by-side relation and initially joined together by severable interconnecting portions to form a one piece integral member readily mated to the circuit framing member before subsequent joining to the base member;
   the circuit framing member being molded of plastic material with several channels recessed in its flat surface means which are dimensioned and configured to receive the one piece electrical circuit means including the circuit elements and the interconnecting portions therebetween and with the channels sufficiently deep to allow the surface means of the circuit elements to be co-planar with the surface means of the framing member so that the two co-planar surface means thereon closely engages the surface means of the base member when the base and framing members are assembled in face-to-face surface contact, whereby the surface means of the circuit means, base member and framing member are in good heat transfer relation;
   ends of some circuit elements extending past the exposed surface of the framing member thereby forming a terminal for a desired wireless hook-up for electrical componentry.

3. An air conditioning control assembly comprising:
   a base member of electrically insulative material and having generally flat surface means;
   a circuit framing member of electrically insulative material and having flat surface means corresponding to the surface means of the base member permitting face-to-face surface overlying engagement when assembled together;
   electrical circuit means captured between the base support member and the circuit framing member;
   the electrical circuit means including several elongated circuit elements extending generally in side-by-side relation and initially joined together by severable interconnecting portions to form a one piece integral member readily mated to the circuit framing member before subsequent joining to the base member;
   the circuit framing member being molded of plastic material with several channels recessed in its flat surface means which are dimensioned and configured to receive the one piece electrical circuit means including the circuit elements and the interconnecting portions therebetween and with the channels sufficiently deep to allow the surface means of the circuit elements to be co-planar with the surface means of the framing member so that the two co-planar surface means thereon closely engages the surface means of the base member when the base and framing members are assembled in face-to-face surface contact, whereby the surface means of the circuit means, base member and framing member are in good heat transfer relation;
   disengageable projections and aperture means on the base and framing members correspondingly located to interfit together to secure the members in surface contact with one another.

4. An air conditioning control assembly comprising: a base member of electrically insulative material and having generally flat surface means;

a circuit framing member of electrically insulative material and having flat surface means corresponding with the surface means of the base member permitting face-to-face surface engagement when in an assembled relationship together;

electrical circuit means captured between the base support member and the circuit framing member;

the electrical circuit means including several elongated circuit elements extending generally in side-by-side relation and initially joined together by severable interconnecting portions to form a one piece integral member readily mated to the circuit framing member before subsequent assembly to the base member;

the circuit framing member being of molded plastic material with several channels recessed in its flat surface means which are dimensioned and configured to receive the one piece means, including the circuit elements and the interconnecting portions therebetween and with the channels sufficiently deep to allow the surface means of the framing member and circuit elements to be co-planar and closely engage the surface means of the base member;

the framing one member and the base member having aperture means therein in corresponding overlying relationship to the interconnecting portions between the circuit elements thereby providing access after mating of the base and frame members to sever the interconnects between the circuit elements;

means to mate the corresponding surface means of the base member and the framing member with the circuit elements therebetween so that the circuit elements engage the members in good heat transfer relationship;

the aperture means of one member in overlying relation to an interconnecting portion of the circuit means and aligned with a channel in the other member to permit sufficient space between the interconnecting portion and the one member for easily severing the interconnecting portion.

* * * * *